United States Patent [19]

Vinegar et al.

[11] Patent Number: 4,769,602
[45] Date of Patent: Sep. 6, 1988

[54] DETERMINING MULTIPHASE SATURATIONS BY NMR IMAGING OF MULTIPLE NUCLIDES

[75] Inventors: Harold J. Vinegar; Pierre N. Tutunjian, both of Houston, Tex.

[73] Assignee: Shell Oil Company, Houston, Tex.

[21] Appl. No.: 881,160

[22] Filed: Jul. 2, 1986

[51] Int. Cl.⁴ ............................................. G01R 33/20
[52] U.S. Cl. ..................................... 324/303; 324/307
[58] Field of Search ............... 324/303, 307, 309, 300, 324/306, 308

[56] References Cited

U.S. PATENT DOCUMENTS

| | | | |
|---|---|---|---|
| 3,238,446 | 3/1966 | Zimmerman | 324/303 |
| 4,022,276 | 5/1977 | Dreher | 324/303 |
| 4,291,271 | 9/1981 | Lauffer | 324/307 |
| 4,411,270 | 10/1983 | Damadian | 324/309 X |
| 4,424,487 | 1/1984 | Lauffer | 324/307 |
| 4,425,547 | 1/1984 | Sugimoto | 324/309 X |
| 4,528,510 | 7/1985 | Loeffler et al. | 324/309 |
| 4,564,811 | 1/1986 | Walker | 324/307 |
| 4,583,044 | 4/1986 | Case et al. | 324/309 |
| 4,636,730 | 1/1987 | Bottomley | 324/318 |
| 4,644,283 | 2/1987 | Vinegar | 73/153 |

FOREIGN PATENT DOCUMENTS 0721736  3/1980  U.S.S.R. .............................. 324/303

Primary Examiner—Michael J. Tokar

[57] ABSTRACT

The present invention provides a method for measuring fluid saturations during multiphase flow in porous media by NMR imaging of preselected nuclides in preselected fluids. For two-phase imaging, one of the fluids to be imaged may contain protons and the other fluid may contain fluorine. For three phase imaging, the third fluid contains neither protons nor fluorine. The radio-frequency transmitters and receivers may be alternated between proton and fluorine Larmor frequencies on sequential or interleaved imaging cycles. Proton and fluorine calibration standards may also be imaged with the sample and the nuclide signal intensities from the sample normalized to the respective proton and fluorine calibration standards. The saturation of two and three-phases may then be determined throughout the porous media. The porosity of a porous media may also be determined from the images of a calibration standard of a first fluid and the media saturated to one hundred percent with the first fluid.

8 Claims, 5 Drawing Sheets

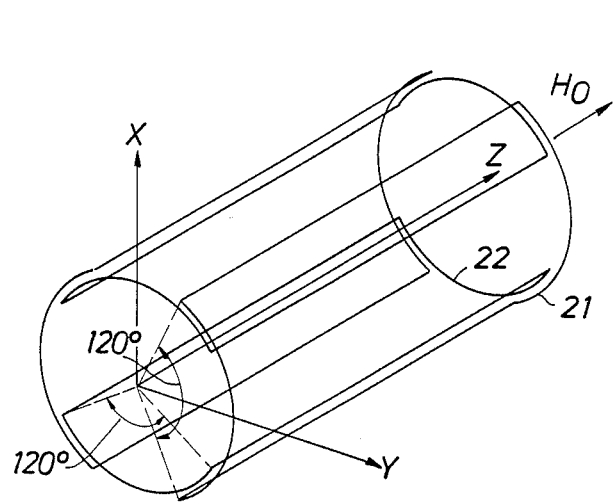
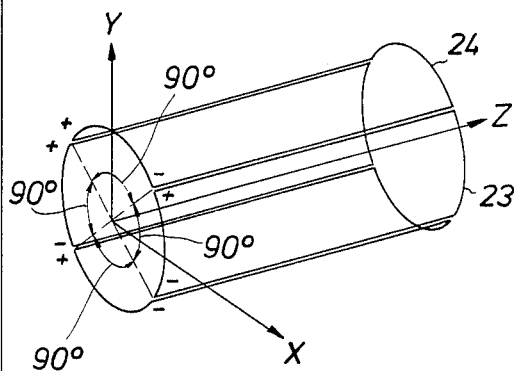
FIG. 3
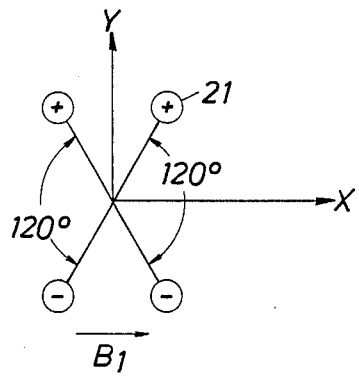
PROTON
SADDLE-
COIL
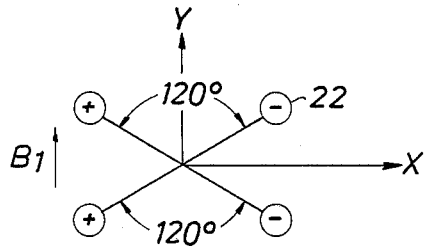
FLUORINE
SADDLE-
COIL
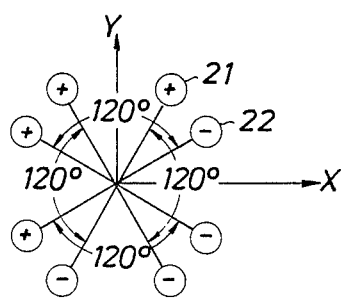
PROTON
AND
FLUORINE
COMBINATION
FIG. 2
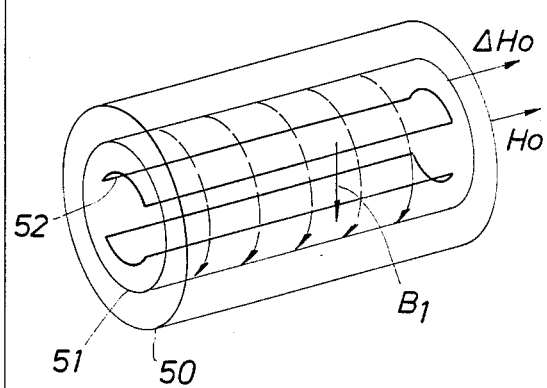
FIG. 5

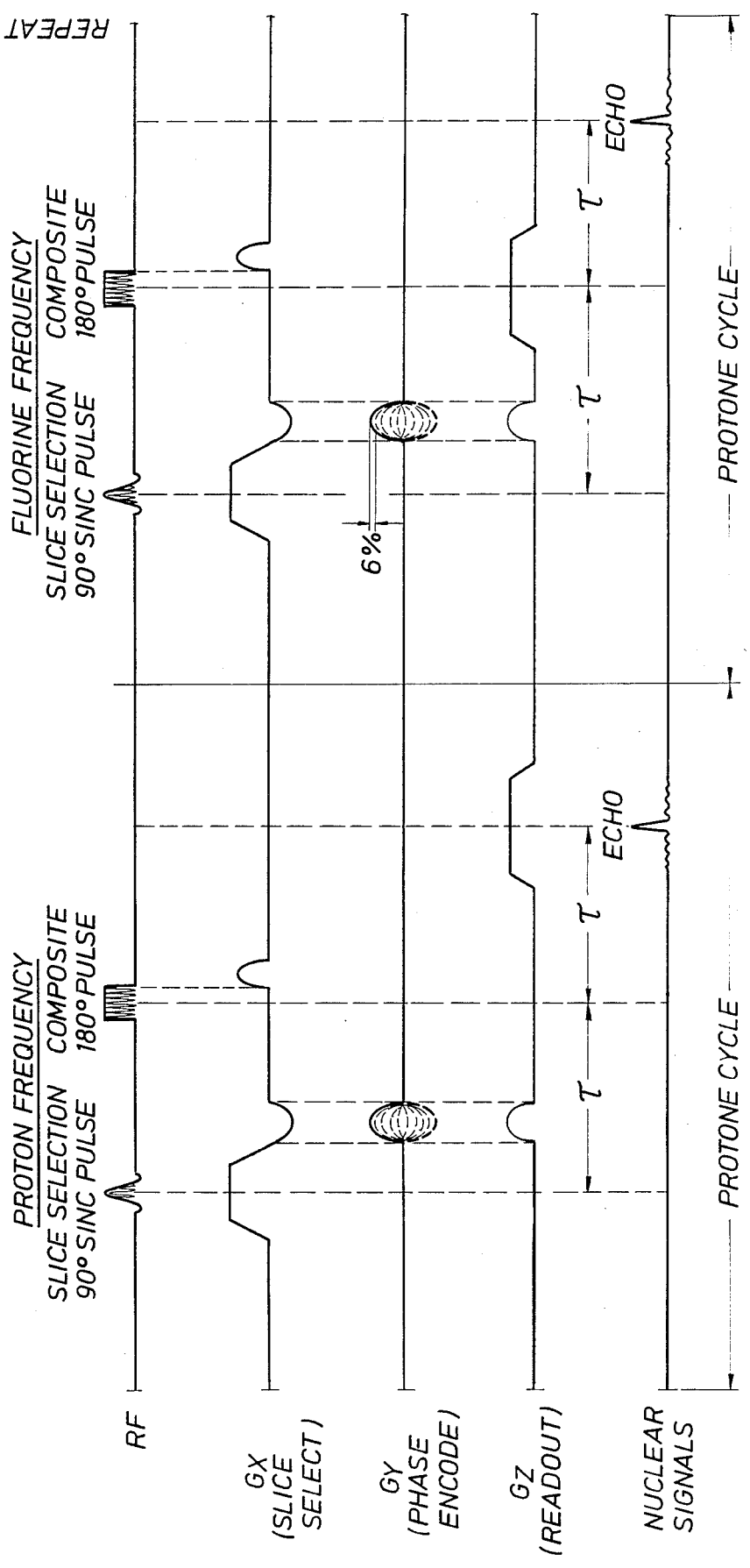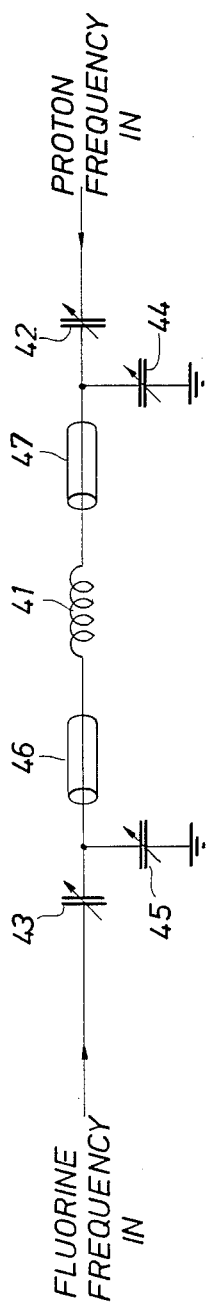

DETERMINING MULTIPHASE SATURATIONS BY NMR IMAGING OF MULTIPLE NUCLIDES

BACKGROUND OF THE INVENTION

This invention relates to Nuclear Magnetic Resonance (NMR) Imaging and more particularly, relates to NMR Imaging of materials to determine petrophysical properties of such materials.

Relative permeability, capillary pressure, and residual oil saturation of an earth formation are important properties needed in the reservoir engineering of an oilfield. These properties help a reservoir engineer determine, for example, the productivity of a reservoir, the total reserves, and the future success of various oil recovery processes, such a waterflooding or carbon dioxide flooding.

The oil industry widely uses laboratory core flood experiments to obtain these and any other properties which may be useful for modeling reservoir performance during primary, secondary, and tertiary oil recovery processes. In any core flood experiments, the major difficulty is determining the actual fluid saturations within the core during the flooding process. Many methods have been used for determining fluid saturations during these core flood displacements, including resistivity, microwave absorption, gamma-ray attenuation, neutron radiography, etc. However, these methods often impose restrictions on experimental techniques and may provide values for saturations that are averaged over a substantial volume of the core.

A recent development, X-ray CT, may be used to obtain three-dimensional images of the fluid saturations during displacement processes at reservoir pressures and temperatures; see for example U.S. Patent Application Ser. No. 623,297, filed June 22, 1984. Although X-ray CT is a major advance over other prior art methods, it unfortunately has some inherent restrictions. Since X-ray CT images are cross-sectional slices of finite thicknesses, typically 1-10 mm thick, it is not possible to simultaneously image the entire core. For any rapid displacement processes, this may result in reconstructed images that are not correct. X-ray attenuation and spectral beam hardening are other difficulties often encountered in X-ray CT Imaging.

These and other limitations and disadvantages of the prior art are overcome by the present invention, however, and improved methods are provided for NMR Imaging of porous materials to measure saturations of fluids inside a sample of such material and to determine petrophysical properties of such material.

SUMMARY OF INVENTION

In a preferred embodiment of the present invention, the saturation of a first preselected fluid in a porous material is determined at a preselected position in the material by imaging a first, preselected nuclear species contained in the first fluid and adjusting this image based upon either an image of the material one hundred percent (100%) saturated by the first fluid at the preselected position in the material, or an image of a calibration sample of the first fluid appropriately modified by the porosity of the material. In like manner, a second preselected nuclear species in a second preselected fluid may be imaged to determine its saturation in the material at the same or a different preselected position in the material. The imaging of the first and second nuclear species may be interleaved to provide saturations for the first and second fluids, essentially simultaneously. A preselected position may include the entire material.

In a presently preferred embodiment of the present invention, an earthen core sample containing multiple fluids during a coreflood experiment is located within an NMR Imaging Apparatus, so that the sample and fluids therein may be imaged. In coreflood experiments conducted for reservoir engineering applications, the three fluid phases may typically be a water or brine phase, an oil or oleic phase, and a gas phase. In a preferred embodiment of the present invention, the preselected nuclear species is the proton for the first preselected fluid, which is a water or brine phase; the proton species may be imaged to determine the spatial distribution of the water or brine saturation at a preselected position in the sample. A preselected position may be a small slice or volume, or the entire core sample. A second preselected fluid may be an oil or oleic phase; a fluorinated hydrocarbon may be used as the oil or oleic phase and fluorine is imaged to measure the spatial distribution of the oleic phase at a preselected position in the sample. A third preselected fluid may be a gas phase, preferably a gas containing neither protons nor fluorine is used, such as air, nitrogen, CO2 etc. The spatial distribution of the gas saturation at a preselected position in the sample is obtained by subtracting the combined brine and oil saturations from the total porosity of the sample at a specific preselected location; porosity may be appropriately measured by NMR Imaging or any other appropriate technique.

Hydrogen and fluorine nuclei are the presently preferred preselected nuclear species to image in this invention because these nuclei have the highest NMR sensitivity; for a constant field strength, if the proton sensitivity is equal to 1.0, then the fluorine sensitivity is approximately 0.85. These two nuclei are many times more sensitive than any of the other nuclei currently employed to generate NMR signals.

As is well known, nuclear magnetic resonance occurs when an applied radio signal satisfies the equation:

$$\omega = \gamma H_o$$

where $\omega$ is the frequency of the radio signal, $H_o$ is the applied magnetic field, and $\gamma$ is the gyromagnetic ratio for that nuclear species. Since hydrogen and fluorine nuclei have gyromagnetic ratios that differ by only 6% (4.258 MHz/kilogauss for $^1$H, 4.006 MHz/kilogauss for $^{19}$F), a single RF coil may be doubly-tuned for both nuclei.

As noted, hereinbefore, the protons in the water or brine phase may be imaged to determine the water or brine saturation. Since fluorine may be easily substituted for protons on any given sample of crude oil, there are a large number of choices of fluorinated hydrocarbons for use as an oil or oleic phase. Such a fluorinated hydrocarbon may easily be blended to match the desired characteristics of an original crude oil.

In preferred embodiments of the present invention the detection of both proton and fluorine NMR signals is accomplished with radiofrequency (RF) coils that may consist preferably of two separate coils tuned individually to the proton and fluorine Larmor frequencies, or may consist of a single RF coil selectively doubly-tuned to either the proton or fluorine resonant frequencies. The appropriate RF transmitters and receivers may then be either electronically or mechanically switched between the proton and fluorine resonances. In an alternate embodiment of the present invention, a single RF coil may be used in conjunction with an auxiliary main field coil for increasing or decreasing the main magnetic field $H_o$ by 6% to switch between proton and fluorine resonant frequencies.

In the presently preferred embodiments of the present invention, any magnetic field gradients employed are increased during the fluorine imaging cycle by an amount equal to the ratio of the gyromagnetic ratios of proton and fluorine, i.e. by a factor of 1.06. This gives about the same spectral linewidths for both the proton and the fluorine images and enables saturation calculations to be performed on both the proton and the fluorine images on a pixel-by-pixel basis without having to spatially rescale the image sizes. Optionally, such rescaling may be performed for particular applications.

These and other features and advantages of the present invention will become apparent from the following detailed description, wherein reference is made to the Figures in the accompanying drawings.

BRIEF DESCRIPTION OF THE DRAWINGS

FIG. 2 depicts two RF orthogonal saddle-coil pairs tuned to proton and fluorine resonant frequencies that may be employed to practice the present invention.

FIG. 3 depicts an alternative arrangement of two RF orthogonal saddle-coil pairs tuned to proton and fluorine resonant frequencies that may be employed to practice the present invention.

FIG. 4 depicts a single RF coil doubly tuned for proton and fluorine resonant frequencies that may be employed to practice the present invention.

FIG. 5 depicts a single RF coil tuned to the proton resonance and a supplemental main field coil which is selectively energized to switch to the fluorine resonance.

FIG. 6 depicts an interlaced proton and fluorine imaging sequence.

FIGS. 8a and 8b depict proton and fluorine NMR images of a core cross section during a coreflood experiment.

DETAILED DESCRIPTION OF PREFERRED EMBODIMENT

Figure 1:
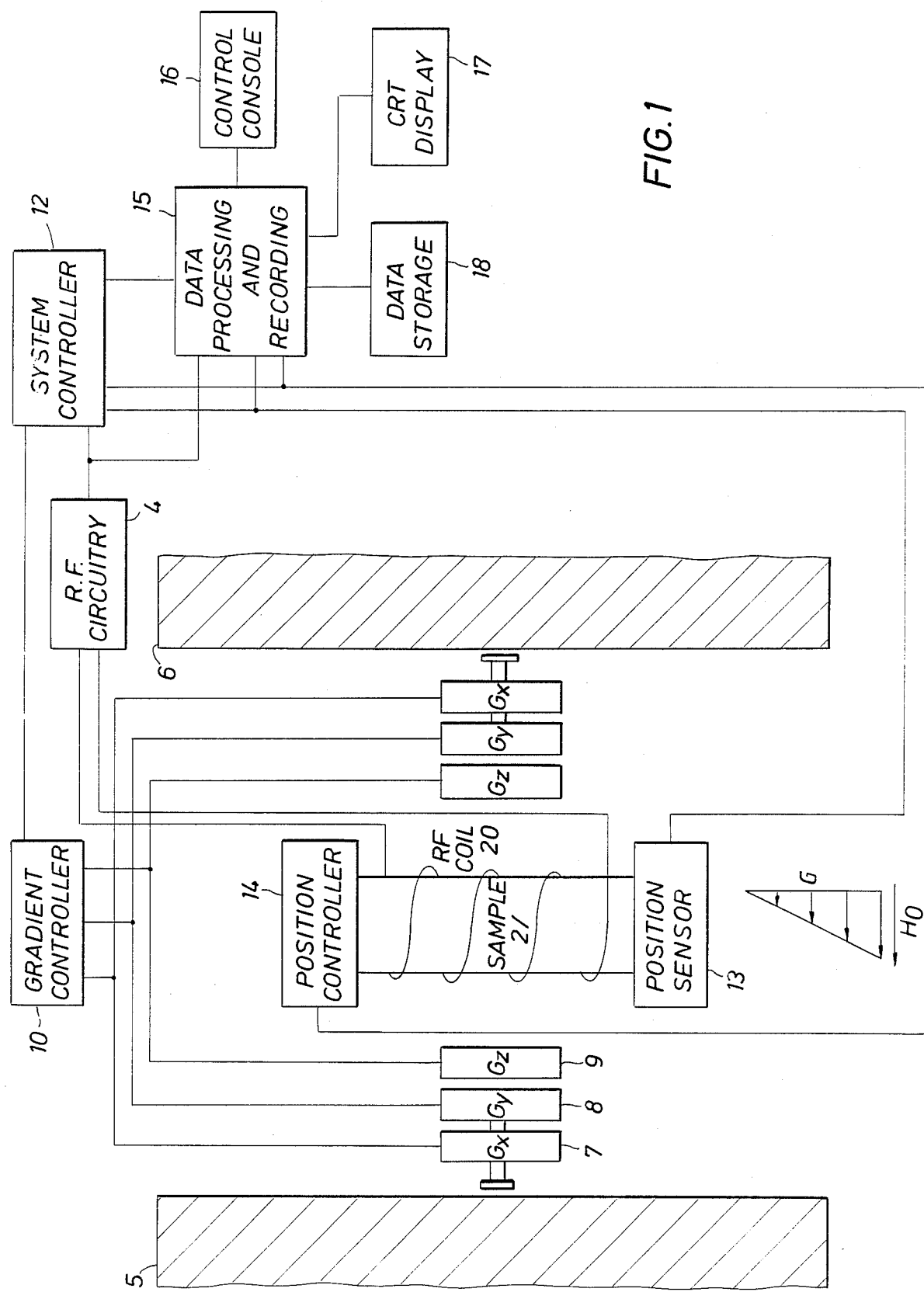
FIG. 1 depicts the main components of an NMR imaging apparatus.

Referring now to FIG. 1, there may be seen a simplified functional drawing of an NMR imaging apparatus suitable for practicing the method of the present invention. In particular, FIG. 1 shows an appropriate porous sample or specimen 2 inside radiofrequency (RF) coils 20 which are connected to radiofrequency circuitry 4. A main magnetic field $H_o$ is produced by magnet 5 and 6 which may be a permanent magnet, an electromagnet, or a superconducting magnet.

Gradient field coils 7, 8, 9 for x, y, and z directions, respectively, are controlled by gradient controller 10 and may be employed to produce appropriate magnetic field gradients Gx, Gy, Gz. Gradient controller 10 may then change the gradient fields electronically by varying the current to the gradient field coils.

System controller 12 controls the radiofrequency circuitry 4 and gradient controller 10. System controller 12 also receives data on the position of specimen 2 through position sensor 13 and controls the position of the specimen 2 with position controller 14. System controller 12 also interfaces with data processing and recording means 15 which also receives data from the radiofrequency circuitry 4 and position sensor 13. Control console 16, CRT display 17, and data storage means 18 for storing images also interface with the data processing and recording means 15. Such NMR imaging apparatus without sample positioning apparatus are known in the art.

NMR imaging was first proposed by P. C. Lauterbur (Nature, Vol. 242, Mar. 16, 1973, pp. 190-191). In NMR imaging, a sample is placed inside a radiofrequency coil situated inside a main magnetic field (usually produced by a superconducting magnet). NMR imaging is similar to NMR spectroscopy except that a magnetic field gradient is also applied to a sample so that the resonant frequencies of the preselected nuclear spins depend on their spatial location within the sample. A Fourier transform of the nuclear free induction decay (FID) represents the projection of the nuclear spin densities perpendicular to the direction of the applied field gradient. An appropriate two-or-three dimensional image may then be reconstructed from two-or-three dimensional Fourier transforms of the appropriate FIDs obtained from a set of magnetic field gradients.

The imaging of the specimen 2 may be over the entire volume of the specimen, a portion of the volume or may be for a thin slice or even a very small volume, depending upon the operation of the gradients and pulse sequences; the physical resolution achieved in such imaging is dependent upon gradient strength, coil diameters, and diffusion times, as discussed in *NMR Imaging In Biomedicine* by P. Mansfield and P. B. Morras, Academic Press (1982). The imaging location in or of the entire specimen is referred to herein as a "preselected location" of the specimen and may refer to the entire volume, a thin slice, or a small volume of the specimen. For fast changing saturations in a specimen, it is presently preferred to image the entire specimen. However, for slow changing saturations it is possible to image the specimen in slices or small volumes depending upon the objects of the experiment. When the whole specimen is imaged the determination of multiple fluid saturations may be most conveniently done in a post-processing mode by a suitable computer, which may be data processing and recording means 15.

In the practice of the method of the present invention, the configuration of radiofrequency coils used depends on whether the main magnetic field is produced by a permanent magnet or by a superconducting magnet 6. In the preferred configuration, a solenoidal superconducting magnet 6 is used. For this case, the sample is placed inside the solenoidal bore of the magnet 6 and the main magnetic field $H_o$ is therefore along the axis of the sample. With this configuration, the radio frequency coils may consist of two orthogonal pairs of saddle coils 21 and 22 tuned to proton and fluorine resonances, respectively, as shown in FIG. 2. As shown in FIG. 2, these orthogonal saddle coils 21 and 22 generate uniform radiofrequency magnetic fields $B_1$ which are orthogonal to each other and also to the main field $H_o$. The orthogonal geometry of proton and fluorine coils minimizes any flux coupling between the proton and fluorine channels and minimizes potential pickup from one channel by the other channel.

The saddle coils 21 and 22 in FIG. 2 are wrapped on an appropriate form (not shown). The coils are wrapped at a radius R, have a length L, and subtend an arc of about 120 degrees each. The form may be constructed from any non-magnetic, non-electrically conducting material of sufficient strength, such as epoxy fiberglass. The presently preferred L/R ratio for optimum magnetic field homogeneity over the coil volume is L/R=3.322; the design of such saddle coils is described by D. M. Ginsberg and M. I. Melchner (Rev. Sci. Inst. 41, 122 [1970]). As shown in FIG. 2, the two saddle-coil pairs 21 and 22 may overlap by about 30 degrees of arc on each side in order to maintain the 120 degrees of arc needed for optimum magnetic field homogeneity. However, this overlap arrangement may result in some crosstalk between proton and fluorine channels. This may be appropriately filtered out with bandpass filters if the coil electrical resonant quality factor (Q) is not adequate to provide this separation.

An alternative configuration of saddle coil pairs 23 and 24 is shown in FIG. 3, where each saddle coil subtends only 90 degrees of arc so that no overlap occurs. This configuration, however, is not presently preferred since it has less magnetic field homogeneity than the embodiment depicted in FIG. 2; a third-order correction to a homogeneous radiofrequency magnetic field $B_1$, is canceled in the coil configuration depicted in FIG. 2 but not in the coil configuration depicted in FIG. 3.

Another alternative embodiment of the present invention is a single radiofrequency coil which is doubly-tuned selectively to either the proton or the fluorine resonances. Preferably, a saddle-coil configuration may be used. FIG. 4 shows a schematic circuit of one implementation of a doubly-tuned RF circuit suitable to practice this invention. This circuit consists of RF coil 41 which can be, for example, a saddle-coil, variable series capacitors 42 and 43, variable parallel capacitors 44 and 45, and switches 46 and 47. Switches 46, 47 may be electronic switches such as solid state TTL-controlled gates, or mechanical switches such as current-activated solenoids. System controller 12 opens switch 46 and closes switch 47 when protons are imaged, and opens switch 47 and closes switch 46 when fluorine nuclides are imaged. Thus, when the proton transmitter is active, the tank circuit effectively consists of coil 41 and parallel capacitor 44 with the left hand side of switch 46 shorting to ground. When the fluorine transmitter is active, the tank circuit effectively consists of coil 41 and parallel capacitor 45, with the right hand side of switch 47 shorting to ground.

The use of two singly-tuned coils as depicted in FIGS. 2 and 3 is presently preferred over a doubly-tuned coil as depicted in FIG. 4 because of the higher Q that may be achieved with a singly-tuned coil. With a singly-tuned coil each coil can be individually optimized and considerably higher Q may result.

The RF coils should be designed to have high enough Q so that the crosstalk between the proton and fluorine frequencies is essentially negligible. For example, for a proton resonance of 100 MHz a Q of 200 results in a full frequency width of 500 KHz, which is sufficiently small compared to the 6 MHz separation of the fluorine resonance to minimize any crosstalk. However, any pickup from the other channel may be suitably filtered out after the RF amplifier using appropriate bandpass filters.

If an electromagnet or a permanent magnet is used instead of a superconducting solenoid to produce the main magnetic field, a doubly-tuned solenoidal RF coil whose axis is perpendicular to the pole pieces may be used. With a superconducting magnet, a solenoid RF coil is not practical because radiofrequency magnetic field $B_1$ must be perpendicular to the main magnetic field $H_o$.

Referring now to FIG. 5, there is shown still another alternative for switching between proton and fluorine resonances. FIG. 5 depicts the use of an extra solenoidal DC coil 51 concentrically aligned with the main superconducting solenoid 50. This extra coil 51 is energized with DC current to change the main magnetic field $H_o$ about 6% to switch between fluorine and proton resonant frequencies. The solenoidal coil 51 may either be a superconducting coil located within the cryostat, or a non-superconducting coil located in the solenoidal bore at room temperature.

If an extra solenoidal main field coil is used, only a single radiofrequency coil 52 need be utilized. The RF coil 52 may then be either a saddle-coil or preferably, a "bird-cage resonator", such as that taught in Hayes et. al., Jour. Mag. Res. 63, 622–628 (1985). However, the disadvantage of this method is the large number of turns and high currents required for the extra solenoidal main field coil to generate a homogeneous field which is 6% of the main superconducting field. The use of such an extra solenoidal coil to boost the main field by 6% may result in "quenching" the superconducting magnet if the current of this coil is too high.

During any fluorine imaging cycle, the gradient fields may be increased by 6% to compensate for the different gyromagnetic ratios of proton and fluorine regardless of the type of radiofrequency coil(s) employed; this is accomplished by the system controller 12 and gradient coils 7, 8 and 9. This keeps the same spectral width of the NMR image and obviates the need for any later rescaling of the size of the fluorine image to be the same size as the proton image. As an alternative, the gradients may be kept the same and a 6% size rescaling can be done to the fluorine or proton image by a post-processing computer employing appropriate software.

The proton and fluorine transmitter and receiver channels are activated sequentially by either electronically switching, or mechanically switching, between the proton and fluorine transmitters and receivers. This is done under the control of system controller 12, using techniques well known in the art. FIG. 6 shows that switching between proton and fluorine data acquisition can be done after each imaging sequence, or alternatively, the switching may occur after a series of imaging sequences. In this way the proton and fluorine data acquisition may be interleaved in time so that the two images are obtained essentially simultaneously.

Figure 7:
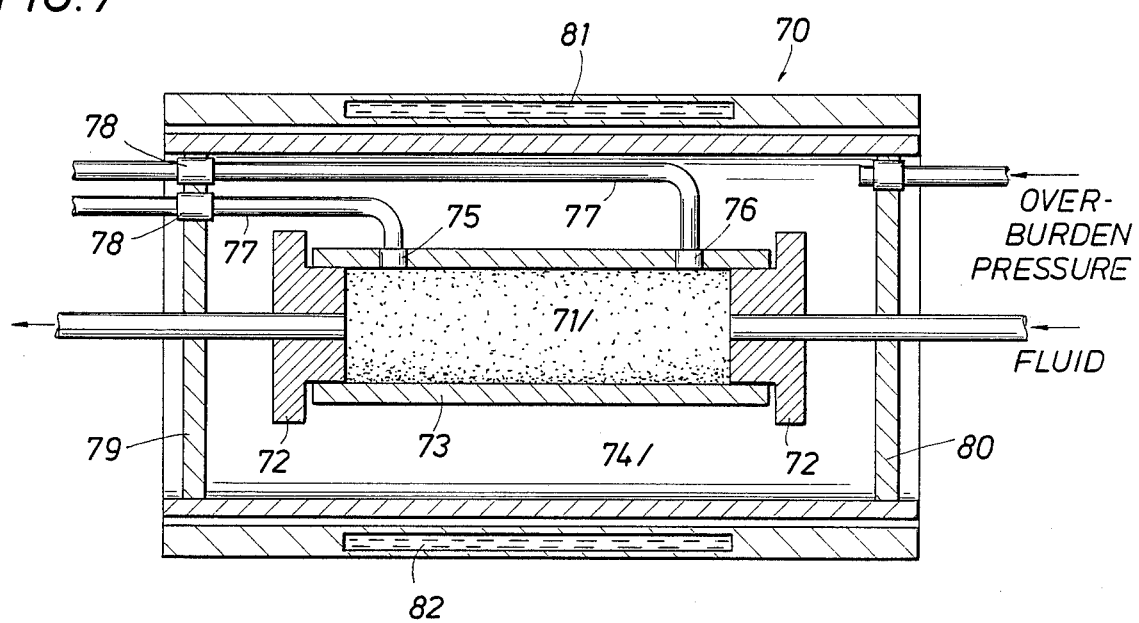
FIG. 7 depicts a pressure vessel constructed from high tensile strength composite suitable for use in NMR Imaging.
Figure 9A:
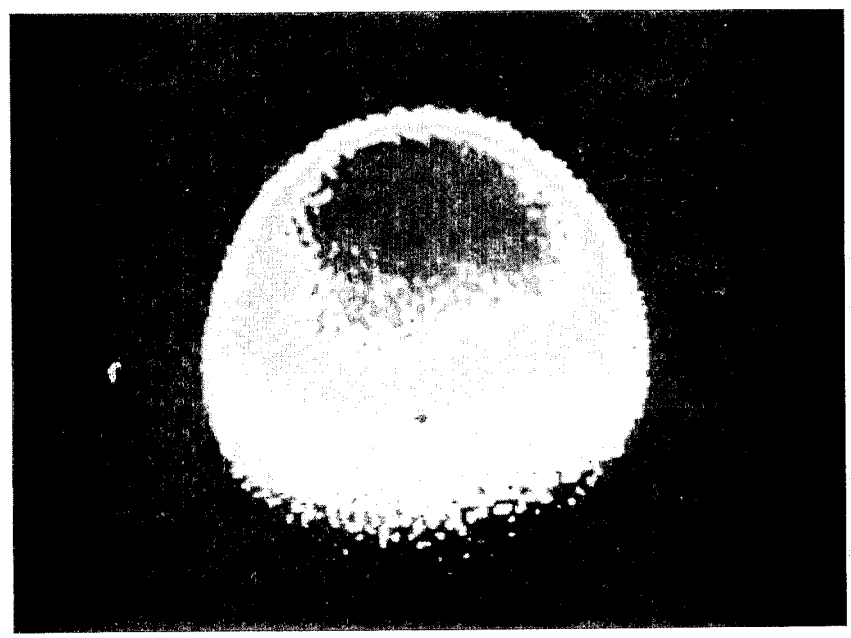
Figure 9B:
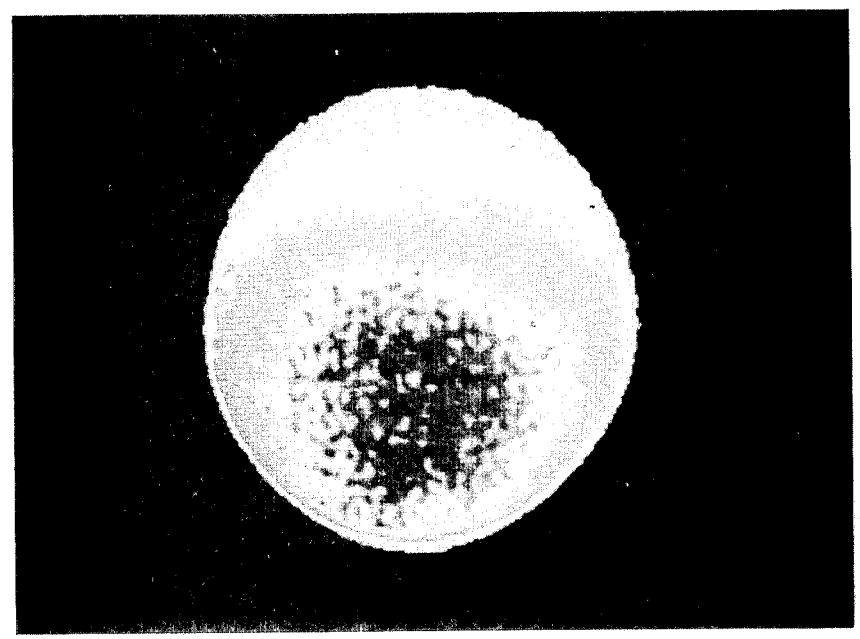

Referring now to FIG. 7 there is shown a pressure vessel suitable for holding an oilfield specimen for coreflood testing inside an NMR imager. The pressure vessel 70 is constructed of a high tensile strength composite material, such as epoxy-reinforced Kevlar, or epoxy fiberglass. The material must be non-magnetic and preferably a non-conductor to prevent radiofrequency attenuation in the pressure vessel. The core sample 71 is held in place by two endpieces 72 and has a rubber sleeve 73 which may supply overburden pressure to the sample from the pressurizing fluid 74. Two pressure taps 75 and 76 are depicted and are used for measuring the pressure differential during flow and are constructed from non-magnetic, non-conducting material such as Nylon or Vespel TM (Dupont trademark). Any number of such pressure taps that may be located physically along the side of sleeve 73 may be so employed. Tubing 77 transmits the fluid pressure through pressure feedthroughs 78 in end cap 79 for measurement by a pressure transducer (not shown) located outside the magnetic field. Tubing 77 is preferably made from thick-walled nylon or teflon tubing. End cap 80 has openings therethrough for passage of fluid into the sample 71 and overburden pressure fluid into the interior of holder 70 to provide overburden pressure, when desired, to the sample 71.

FIG. 7 also shows optional calibration vials 81 and 82 containing 100% of a first preselected fluid, preferably brine, to be imaged for protons and 100% of a second preselected fluid, preferably a fluorinated oil, to be imaged for fluorine, respectively, for a typical coreflood experiment. However, other preselected fluids containing other preselected nuclides may be employed. Any such proton and fluorine calibration sources may be optionally imaged simultaneously with the core sample and may be appropriately located either inside or outside the pressure vessel. The signal intensities in each pixel of the core image may be normalized to the signal intensities from the calibration vials to determine the appropriate saturation. The term "pixel" is used herein to mean an element of the matrix making the picture or image. This procedure compensates for any changes in the electrical resonant quality factor (Q) of the RF coil or for variations in amplifier gain that might occur during a long duration coreflood experiment. The use of such calibration vials of preselected fluids containing preselected nuclides is presently preferred in the methods of the present invention.

In a typical coreflood experiment, the three preselected fluid phases are typically a water or brine phase, an oil or oleic phase, and a gas phase. In accordance with the present invention, the proton signal from the water or brine phase is imaged to determine the spatial distribution of the brine saturation within the sample. For the oil or oleic phase, an appropriate fluorinated hydrocarbon is used and fluorine imaged measures the spatial distribution of the oleic phase within the sample. For the gas phase, a gas containing neither protons nor fluorine is used, such as air, nitrogen, carbon dioxide, etc. The spatial distribution of the gas saturation is obtained by subtracting the combined brine and oil saturations from the total porosity, as explained hereinbelow. For less than three phases in a coreflood experiment, the two (or one) phases may be measured directly, or one phase measured and the other phase determined from the measured phase and a phase equation in a maner analogous to the determination of gas saturation as noted hereinabove and hereinbelow.

The preferred procedure for determining the saturations of preselected fluids of brine, oil and gas consists of the following steps. The core is first saturated 100% with brine and the imaged for a preselected nuclide, i.e. proton. If the level of the proton signal at a preselected location of the core is $(V_H)_{100}$ and the proton signal level in a calibration vial containing this same brine is $(V_H)_{CAL}$, then the porosity $\phi$ at that preselected core location is:

$$\phi = (V_H)_{100}/(V_H)_{CAL} \tag{1}$$

This image of the porosity may be stored in data storage means 18 for later use. The calculation of the porosity image may be performed by a post-processing computer employing appropriate software, or in real-time by data processing and recording means 15. Durng the coreflood experiment, when the proton signal level is $V_H$, the brine saturation $S_w$ at a preselected location of the core is computed from:

$$S_w = V_H/(V_H)_{100} = V_H/\phi(V_H)_{CAL} \tag{2}$$

where the computation may be carried out on a pixel-by-pixel basis using the previously stored porosity image. Although the use of calibration samples is preferred, from equation (2) it may be seen that the brine saturation may be determined without employing a calibration sample of the brine. These computations may be performed in a real-time mode or in a post-processing mode. The brine saturation image may be stored in data storage means 18. Similarly, when the fluorine signal level is $V_F$, the oil saturation at the preselected location of the core is computed from:

$$S_o = V_F/(V_F)_{100} = V_F/\phi(V_F)_{CAL} = V_F/(V_F)_{CAL} \times (V_H)_{CAL}/(V_H)_{100} \tag{3}$$

which is again computed on a pixel-by-pixel basis using the previously stored porosity image. Again, the oil saturation may be determined without employing a calibration sample of the oil. Again, these computations may be performed in a real-time mode or in a post-processing mode. The oil saturation image may also be stored in data storage means 18. Finally, the gas saturation image is obtained from brine saturation and oil saturation images on a pixel-by-pixel basis as follows:

$$S_g = 1 - S_w - S_o. \tag{4}$$

These computations may be performed in a real-time or post-processing mode.

The optional calibration vials of preselected fluids such as brine and oil, each containing preselected nuclides preferably extend for the full length of the core sample; they may optionally be less than the full length of the core sample and their images appropriately stored for comparisons in data storage means 18. The comparison of the core sample 100% saturated with a first preselected fluid with a corresponding calibration vial of that first preselected fluid may be employed to calculate the porosity, $\phi$, on a pixel-by-pixel basis. Alternatively, if porosity, $\phi$, is known from any conventional technique, then the requirement to image the 100% saturated core is eliminated, and the calibration signal is merely reduced by a proportion based on $\phi$, as noted hereinabove in equation 2. Preferably, the 100% saturated core is imaged to obtain a more accurate measurement of porosity, $\phi$, throughout the sample.

Alternatively, the sample may be saturated to 100% with a first preselected fluid and the sample imaged at a preselected location to determine the signal of the first preselected nuclide of the first preselected fluid or phase at that location, $(V_p)_{100}$. The sample may then undergo coreflood experiments and the saturation of the first phase at a preselected location, $S_p$, determined from the signal of first phase, $V_p$, from $S_p = V_p/(V_p)_{100}$. Similarly, for any second preselected fluid or phase, its saturation at a preselected location, may be determined, from its second preselected nuclide.

A fluorinated hydrocarbon may be used as a second preselected fluid and employ fluorine as its nuclide; such an oil phase should have equivalent fluorines to prevent any chemical shift splittings. For example, on a fluorinated methyl group ($CF_3$) the three fluorine nuclei are equivalent and give rise to a single NMR line. Another example of equivalent fluorine nuclei is a fluorinated benzene ring which has six equivalent fluorine atoms. If nonequivalent fluorine atoms are used, large chemical shift splitting of fluorine may cause a broader NMR line and consequent loss of signal strength. For maximum fluorine sensitivity, a fluorocarbon should be chosen which maximizes DN/M, where D is the fluorocarbon density, N is the number of flourine atoms/molecule, and M is the molecular weight.

However, a preselected fluid may also contain both a first and second preselected nuclide; for example, an oleic phase may contain both fluorine and protons, as long as the brine phase contains no fluorine. Thus a suitable fluorinated hydrocarbon could be fluorobenzene ($C_6H_5F$) or fluorooctane [$(CH_3(CH_2)_6CH_2F)$] which contain both fluorine and protons. In this case the fluorine signal is used to determine the oleic phase saturation, but the oleic phase also contributes a known proton signal. This proton signal from the oleic phase can then be subtracted from the total proton signal of both the oleic and brine phases to determine the brine saturation.

As an alternative to the use of fluorinated hydrocarbons, a normal hydrocarbon may be used as a preselected fluid, i.e. the oleic phase. Then the proton is the second preselected nuclide and proton imaging is then used to measure the oleic phase saturation. For a normal hydrocarbon, deuterated water may be used as a preselected fluid with dissolved NaF or KF salt; this preselected fluid and preselected nuclide (fluorine) may then be used for the brine phase and the brine saturation is measured by imaging the preselected nuclide, fluorine. Although this is a possible alternative approach, the fluorine sensitivity achievable in this method is much smaller than if a fluorinated hydrocarbon is used since these salts have only a limited solubility in water (four parts per hundred $H_2O$ for NaF at 20 deg C.; ninety-five parts per hundred $H_2O$ for KF at 20 deg C.). Thus, the fluorine sensitivities obtained with hexafluorobenzene ($C_6F_6$) is about three times the fluorine sensitivities obtained with deuterated water saturated with KF.

Referring now to FIG. 8, there are shown two partial cross-sectional images of a Berea sandstone core. FIG. 8a shows the proton image and FIG. 8b shows the corresponding fluorine image. Note that the fluorinated hydrocarbon was heavier and therefore has a higher saturation near the bottom of the core. These images were taken on a Bruker NMR imaging spectrometer using a CXP 200 console and an electromagnet operating at 0.85 Tesla (35 MHz proton frequency). The spectrometer was mechanically switched between the proton and fluorine resonant frequencies.

Many other variations and modifications may be made in the techniques hereinbefore described, by those having experience in this technology, without departing from the concepts of the present invention. Accordingly, it should be clearly understood that the methods depicted in the accompanying drawings and referred to in the foregoing description are illustrative only and are not intended as limitations on the scope of the invention.

What is claimed is:

1. A method for determining the saturation of at least one preselected fluid at a preselected location in a porous material, comprising:
    placing said material in an NMR Imaging apparatus,
    imaging said material employing magnetic fields and gradients suitable for at least one preselected nuclei species corresponding to at least one preselected fluid to determine an image of said nuclei, and
    determining the saturation of said at least one fluid at said preselected location in said material from said image.

2. A method as described in claim 1, further comprising:
    imaging said material employing magnetic fields and gradients suitable for a second preselected nuclei species corresponding to a second preselected fluid to determine an image of said second nuclei, and
    determining the saturation of said second fluid at said preselected location in said material from said image of said second nuclei.

3. A method as described in claim 1, further comprising:
    adding a preselected component with a preselected nuclei to said at least one preselected fluid.

4. A method for determining the saturation of at least one preselected fluid at a preselected location in a porous material, comprising:
    placing said material and at least one calibration sample of said at least one preselected fluid in an NMR Imaging apparatus,
    imaging said material and said sample employing magnetic fields and gradients suitable for at least one preselected nuclei species corresponding to said at least one preselected fluid to determine an image of said nuclei, and
    determining the saturation of said at least one fluid at a preselected location in said material from said image.

5. A method for determining the saturation of at least one preselected fluid at a preselected location in a porous material, comprising:
    placing said material and at least one calibration sample of said at least one preselected fluid in an NMR Imaging apparatus,
    saturating said material with said preselected fluid to one hundred percent saturation throughout,
    imaging a preselected nuclide in said preselected fluid at a preselected location in said material and in said calibration sample,
    calculating porosity of said material at said preselected location from images of said preselected fluid and calibration sample,
    changing the saturation of said preselected fluid in said material,
    imaging said preselected nuclide in said preselected fluid at said preselected location in said material, and
    determining the saturation of said at least one fluid at a preselected location in said material from said image.

6. A method as described in claim 5, further comprising:
    providing said sample with a second preselected fluid,
    imaging a second preselected nuclide in said second preselected fluid at said preselected location in said material to determine an image of said second nuclide, and
    determining the saturation of said second fluid at a preselected location in said material from said image of said second nuclide.

7. A method as described in claim 5, wherein said steps for imaging at said preselected location in said material comprises, imaging said material throughout its entire volume, storing said image, and preselecting a location on a pixel-by-pixel basis from said stored image.

8. A method for determining the porosity of a material, comprising:
   placing said material and a calibration sample of a preselected fluid in an NMR Imaging apparatus, saturating said material with said preselected fluid to one hundred percent saturation throughout,
   imaging a preselected nuclide in said preselected fluid at a preselected location in said material and in said calibration sample, and
   determining porosity for said preselected location in said material from images of said preselected fluid and calibration sample.

* * * * *